(12) United States Patent
Muraki

(10) Patent No.: US 6,472,674 B1
(45) Date of Patent: Oct. 29, 2002

(54) ELECTRON BEAM EXPOSURE SYSTEM AND METHOD OF MANUFACTURING DEVICES USING THE SAME

(75) Inventor: Masato Muraki, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/627,789

(22) Filed: Jul. 27, 2000

Related U.S. Application Data

(63) Continuation of application No. 08/856,863, filed on May 15, 1997, now Pat. No. 6,124,599.

(51) Int. Cl.[7] ......................... H01J 37/30; H01J 37/302
(52) U.S. Cl. .................. 250/492.22; 250/397; 250/398
(58) Field of Search ......................... 250/492.22, 397, 250/398, 492.2

(56) References Cited

U.S. PATENT DOCUMENTS

| 4,823,012 A | 4/1989 | Kosugi ..................... 250/491.1 |
|---|---|---|
| 4,829,444 A | 5/1989 | Saitou et al. ................ 364/468 |
| 4,996,434 A | 2/1991 | Tanaka ..................... 250/492.3 |
| 5,130,547 A | 7/1992 | Sakamoto et al. ........ 250/492.2 |
| 5,144,142 A | 9/1992 | Fueki et al. ............. 250/396 R |
| 5,243,377 A | 9/1993 | Umatate et al. ............... 355/53 |
| 5,323,440 A | 6/1994 | Hara et al. ..................... 378/34 |
| 5,442,163 A | 8/1995 | Nakahara et al. ........... 235/381 |
| 5,521,392 A | 5/1996 | Kennedy et al. .......... 250/492.1 |
| 5,525,808 A | 6/1996 | Irie et al. ..................... 250/548 |
| 6,124,599 A | * 9/2000 | Muraki ................. 250/492.22 |

* cited by examiner

*Primary Examiner*—Bruce Anderson
(74) *Attorney, Agent, or Firm*—Fitzpatrick, Cella, Harper & Scinto

(57) ABSTRACT

An electron beam exposure system which includes a plurality of electron beam exposure apparatuses and achieves reduction in the memory of an electron beam exposure apparatus by eliminating data transfer/data conversion for each electron beam exposure apparatus. The plurality of electron beam exposure apparatuses of the electron beam exposure system deflect an electron beam on the basis of control data and expose a pattern onto an object to be exposed, and a data control device sends, on the basis of pattern information of a pattern to be exposed which is sent out from one of the electron beam exposure apparatuses, control data corresponding to the pattern to be exposed to the electron beam exposure apparatus which has sent the pattern information. Also disclosed is a method of manufacturing devices, which utilizes a plurality of electron beam exposure apparatuses.

22 Claims, 14 Drawing Sheets

FIG. 8

| | | A(1, 1) | | G(5, 5) |
|---|---|---|---|---|
| 1 | (x, y) | τ | ··· | τ |
| 2 | (x, y) | τ | ··· | τ |
| ⋮ | ⋮ | ⋮ | | ⋮ |
| n | (x, y) | τ | ··· | τ |

(SEQUENTIAL No.) (ARRAY POSITION)   (BLANKING OPERATION TIME)

ELECTRON BEAM EXPOSURE SYSTEM AND METHOD OF MANUFACTURING DEVICES USING THE SAME

This application is a continuation of application Ser. No. 08/856,863, filed May 15, 1997 U.S. Pat. No. 6,124,599.

BACKGROUND OF THE INVENTION

1. Field of the Invention

The present invention relates to an electron beam exposure system having a plurality of electron beam exposure apparatuses and a method of manufacturing devices using the exposure system.

2. Description of the Related Art

In electron beam exposure apparatuses, which deflect electron beams and expose patterns onto objects to be exposed, there has been a tendency for the amount of data necessary to control the electron beams to increase significantly as semiconductor element patterns to be exposed onto objects to be exposed get finer. Furthermore, since semiconductor elements, which are made into finer patterns, are made with increased multilayering, the number of times different patterns are exposed tends to increase.

However, the amount of control data corresponding to patterns to be exposed, which can be stored in an electron beam exposure apparatus, is limited. For this reason, each time a pattern to be exposed is changed, the electron beam exposure apparatus needs to perform an operation for transferring the pattern data for the patterns to be exposed and for converting the pattern data into control data. Therefore, in semiconductor manufacturing, this results in a problem of decreasing productivity, which occurs to a greater extent.

SUMMARY OF THE INVENTION

To solve the above-described problems, according to a first aspect of the present invention, there is provided an electron beam exposure system, comprising: a plurality of electron beam exposure apparatuses, which each deflects an electron beam on the basis of control data and exposes a pattern onto an object to be exposed; and data control means for sending, on the basis of pattern information related to a pattern to be exposed which is sent out from one of the plurality of electron beam exposure apparatuses, control data, corresponding to the pattern to be exposed, to one of the plurality of the electron beam exposure apparatuses, which sent the pattern information to the data control means.

Preferably, each of the electron beam exposure apparatuses includes detection means for detecting, in advance, pattern information related to a pattern to be exposed onto the object to be exposed, and control means for (i) comparing, with the detected pattern information, pattern information related to a pattern corresponding to control data held in the one of the plurality of electron beam exposure apparatuses, and (ii) sending the detected pattern information to the data control means when the detected pattern information does not match the held pattern information.

Preferably, the data control means includes storing means for storing a plurality of control data corresponding to mutually different patterns.

Preferably, the data control means generates, from pattern data, control data for the plurality of electron beam exposure apparatuses, which data corresponds to the pattern.

Preferably, the control data includes data for controlling a deflection position of an electron beam and data for controlling the length of time the electron beam is irradiated at the deflection position.

Preferably, the data control means is contained in a space having a lower degree of cleanness than a space in which the plurality of electron beam apparatuses are contained.

According to a second aspect of the present invention, there is provided a method of manufacturing devices, comprising: providing a plurality of electron beam exposure apparatuses, which each deflects an electron beam on the basis of control data and exposes a circuit pattern onto a wafer; and providing data control means, which sends, on the basis of pattern information related to a circuit pattern to be exposed which is sent out from one of the plurality of electron beam exposure apparatuses, control data, corresponding to the pattern to be exposed, to the one of the plurality of the electron beam exposure apparatuses, which sent the pattern information to the data control means.

Preferably, the method of manufacturing devices further comprises detecting, in advance, using each of the electron beam exposure apparatuses, pattern information related to a circuit pattern to be exposed onto the wafer, then comparing, with the detected pattern information, pattern information for a circuit pattern corresponding to control data held in the one of the plurality of electron beam exposure apparatuses, and sending the detected pattern information to the data control means when the detected pattern information does not match the held pattern information.

Preferably, the method of manufacturing devices further comprises storing, in the data control means, a plurality of control data corresponding to mutually different circuit patterns.

Preferably, the method of manufacturing devices further comprises generating, by the data control means, control data for each of the plurality of electron beam exposure apparatuses, on the basis of data related to a circuit pattern, which control data corresponds to the circuit pattern.

Preferably, in the method of manufacturing devices, the control data includes data for controlling a deflection position of an electron beam and data for controlling a length of time that the electron beam irradiates the deflection position.

Preferably, the method of manufacturing devices further comprises containing the data control means in a space having a lower degree of cleanness than a space in which the plurality of electron beam apparatuses are contained.

According to a third aspect of the present invention, there is provided an electron beam exposure apparatus which deflects an electron beam on the basis of control data corresponding to a pattern to be exposed and exposes the pattern onto an object to be exposed, the apparatus comprising: means for storing a plurality of control data corresponding to different patterns; detection means for detecting, in advance, pattern information related to a pattern to be exposed onto the object to be exposed; and control means for selecting control data corresponding to the detected pattern information from the storing means and exposing the object to be exposed on the basis of the selected control data.

Preferably, the control data includes data for controlling a deflection position of an electron beam and data for controlling the length of time the electron beam is irradiated at the deflection position.

According to a fourth aspect of the present invention, there is provided a method of manufacturing devices by using an electron beam exposure apparatus which deflects an electron beam on the basis of control data corresponding to a circuit pattern to be exposed and which exposes the circuit pattern onto a wafer, the method comprising: storing a plurality of control data corresponding to different circuit patterns; detecting, in advance, pattern information related to a circuit pattern to be exposed onto the wafer; and selecting control data corresponding to the detected pattern information from the plurality of control data stored in the storing step and exposing the wafer on the basis of the selected control data.

Preferably, the control data includes data for controlling a deflection position of an electron beam and data for controlling the length of time the electron beam is irradiated at the deflection position.

The above and further objects, aspects and novel features of the invention will become more apparent from the following detailed description when read in connection with the accompanying drawings.

BRIEF DESCRIPTION OF THE DRAWINGS

FIG. 8 shows exposure control data;

DESCRIPTION OF THE PREFERRED EMBODIMENT

[Description of the Structural Elements of an Electron Beam Exposure Apparatus which Constitutes an Electron Beam Exposure System]

Figure 1A:
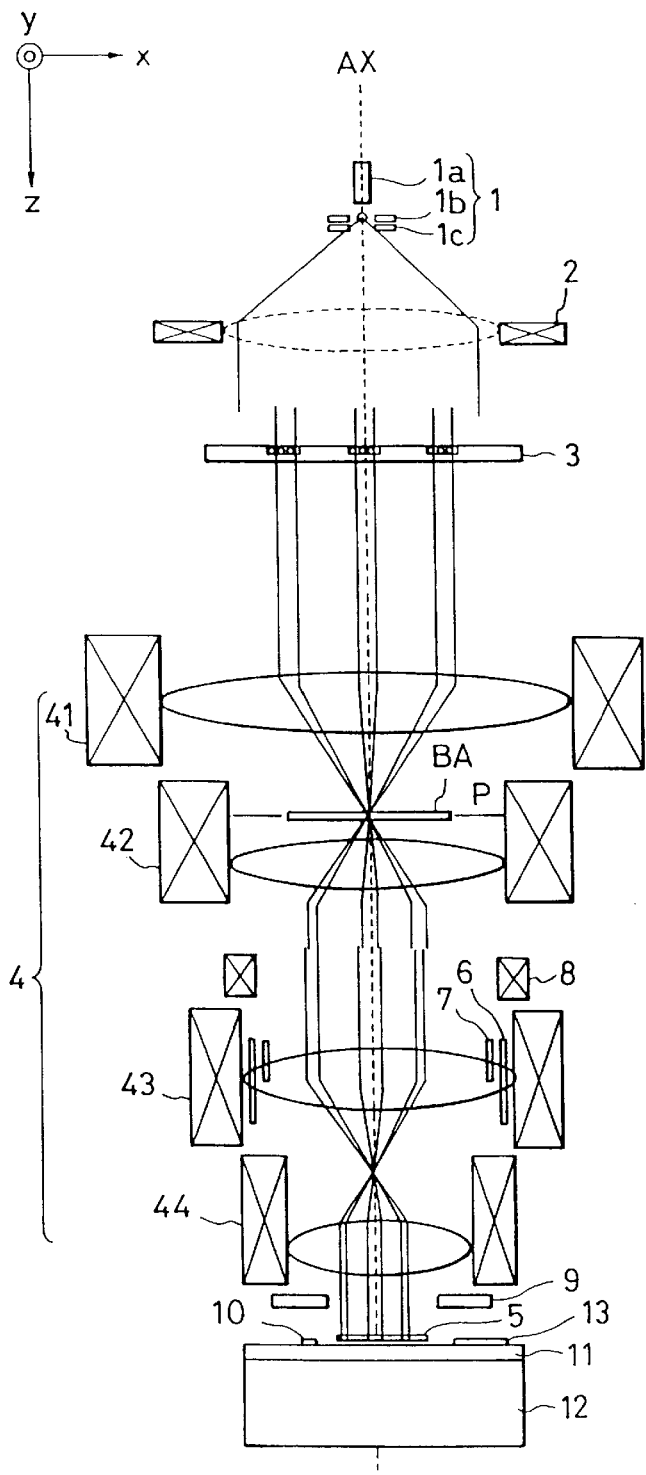
FIG. 1 is a schematic view of the essential portion of an electron beam exposure apparatus according to the present invention.
Figure 1B:
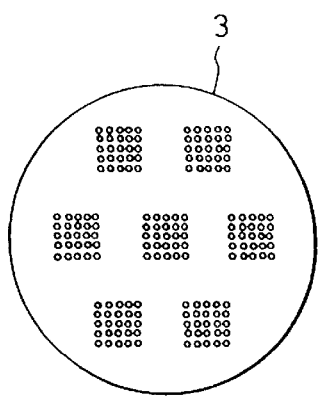
Figure 1C:
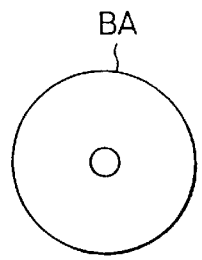

FIG. 1 is a schematic view of the essential portion of an electron beam exposure apparatus according to the present invention.

Shown in FIG. 1 is an electron gun or source 1 formed of a cathode 1a, a grid 1b, and an anode 1c. Electrons emitted from the cathode 1a form a crossover image between the grid 1b and the anode 1c (hereinafter, this crossover image is referred to as an electron source 1).

Electrons emitted from the electron source 1 are formed into a substantially collimated electron beam by a condenser lens 2 whose front focus position is at the electron source position. The substantially collimated electron beam enters an element electro-optical system array 3. The element electro-optical system array 3 is arrayed such that a plurality of element electro-optical systems formed of a blanking electrode, an aperture, and an electron lens are arrayed in a direction perpendicular to the optical axis AX. The details of the element electro-optical system array 3 will be described later.

The element electro-optical system array 3 forms a plurality of intermediate images of the electron source, with each intermediate image being reduction-projected by a reduction electro-optical system 4, to be described later, forming an electron source image on a wafer 5.

In such a case, the respective elements of the element electro-optical system array 3 are set so that the spacing between the electron source images on the wafer 5 become an integral multiple of the size of the electron source image. Further, in the element electro-optical system array 3, the position of each intermediate image along the direction of the optical axis AX is made different according to the image plane curvature of the reduction electro-optical system 4, and aberration, which occurs when each intermediate image is reduction-projected onto the wafer 5 by the reduction electro-optical system 4, is corrected beforehand.

The reduction electro-optical system 4 is formed of a symmetrical magnetic doublet that includes a first projection lens 41 (43) and a second projection lens 42 (44). When the focal length of the first projection lens 41 (43) is denoted as f1 and the focal length of the second projection lens 42 (44) is denoted as f2, the distance between these two lenses becomes f1+f2. The object point on the optical axis AX is at the focus position of the first projection lens 41 (43), and the image point thereof is converged at the focal point of the second projection lens 42 (44). This image is reduced to −f2/f1. Also, since the magnetic fields of the two lenses act in mutually opposite directions, theoretically, Seidel aberration, excluding spherical aberration, isotropic astigmatism, isotropic coma aberration, image-plane curvature aberration, axial chromatic aberration, and chromatic aberration concerning rotation and magnification are cancelled.

Also shown in FIG. 1 is a deflector 6 for deflecting a plurality of electron beams from the element electro-optical system array 3 and for displacing a plurality of electron source images by substantially the same amount in the X and Y directions on the wafer 5. The deflector 6 is formed of a main deflector (not shown), which is used when the deflection width is wide and a sub-deflector (not shown), which is used when the deflection width is narrow. In this embodiment, the main deflector is a magnetic deflector, and the sub-deflector is an electrostatic deflector.

Further shown in FIG. 1 are a dynamic focus coil 7 for correcting deviation of the focus position of the electron source image, which is caused by deflection aberration when the deflector 6 is operated, and a dynamic stigmator 8 for correcting astigmatism of the deflection aberration, which occurs by deflection in a manner similar to that corrected by the dynamic focus coil 7.

Further shown in FIG. 1 are a reflection electron detector 9 for detecting reflected electrons or secondary electrons, which occur when an electron beam from the element electro-optical system array 3 radiates an alignment mark formed on the wafer 5 or a mark on a stage reference plate 13, a Faraday cup 10, having two single knife edges extending in the X and Y directions, for detecting the amount of charge of an electron source image formed by the electron beam from the element electro-optical system, a θ-Z stage 11, on which a wafer is placed, which is movable in the direction of the optical axis AX (Z axis) and in the direction of rotation about the Z axis, with the above-mentioned stage reference plate 13 and Faraday cup 10 being secured thereto, and an XY stage 12, on which the θ-Z stage 11 is placed, which is movable in the X and Y directions perpendicular to the optical axis AX (Z axis).

Figure 2A:
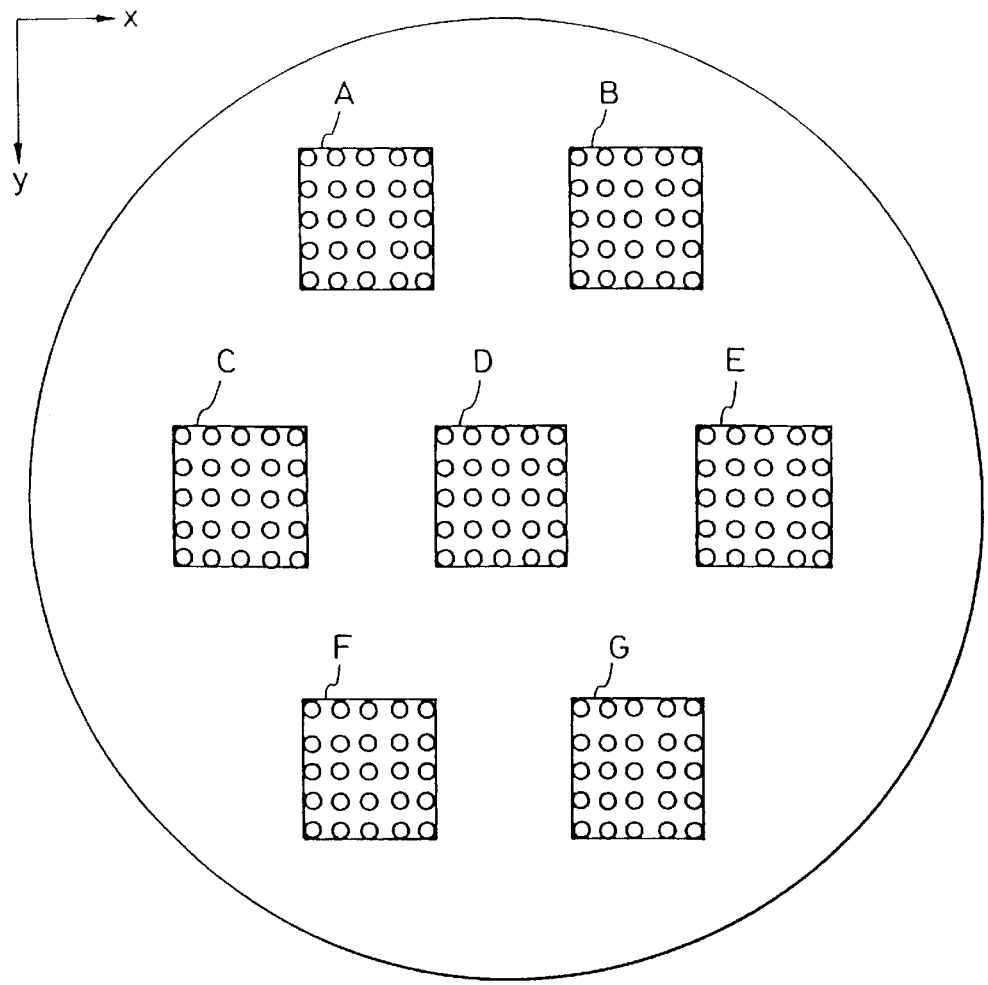
FIGS. 2A and 2B show an element electro-optical system array 3.
Figure 2B:
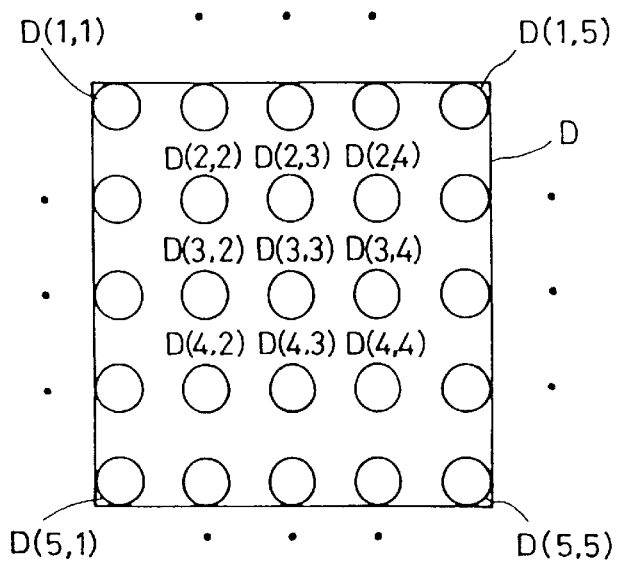

Next, referring to FIGS. 2A and 2B, the element electro-optical system array 3 will be described.

The element electro-optical system array 3 is formed into a group (sub-array) of a plurality of element electro-optical systems, with a plurality of sub-arrays thereof being formed. In this embodiment, seven sub-arrays A to G are formed. In each sub-array, a plurality of element electro-optical systems are arrayed two-dimensionally. In each sub-array of this embodiment, 25 element electro-optical systems are formed as D (1,1) to D (5,5), and each element electro-optical system forms electron source images which are arrayed at a spacing having a pitch Pb ($\mu$m) in both the X and Y directions on the wafer via the reduction electro-optical system 4.

Figure 3A:
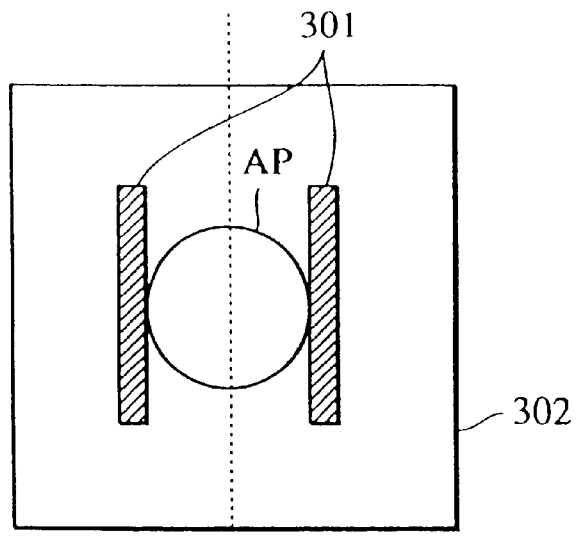
FIG. 3 shows an element electro-optical system.
Figure 3B:
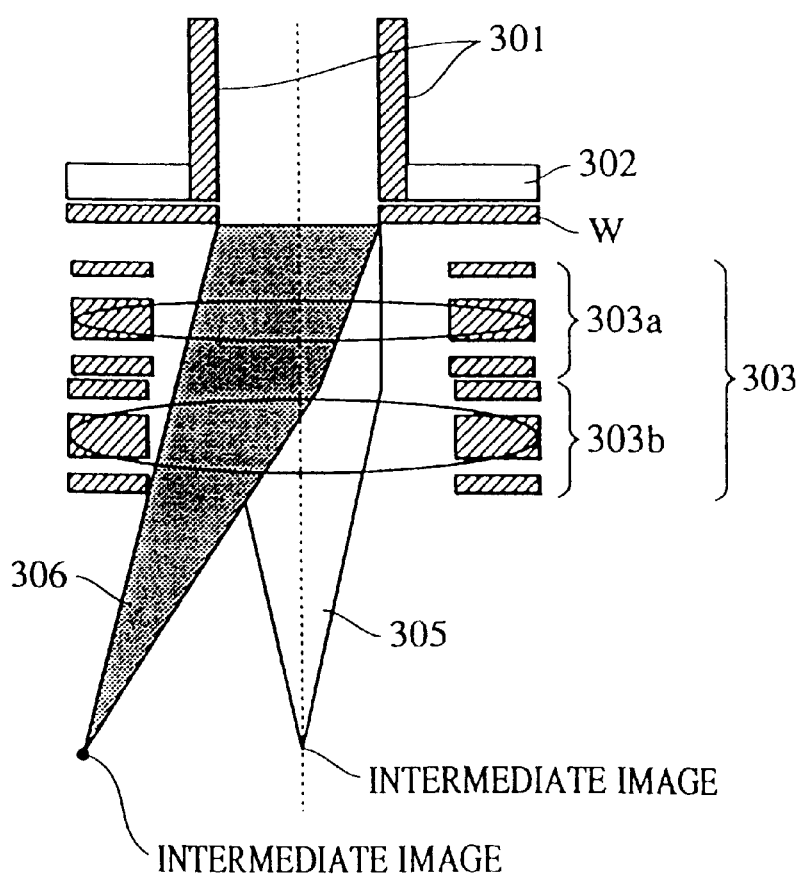

A sectional view of each element electro-optical system is shown in FIG. 3.

Shown in FIG. 3 is a blanking electrode 301 formed of a pair of electrodes and having a deflection function, a substrate 302 having an aperture (AP) which defines the shape of an electron beam which is transmitted therethrough and is in common use for the other element electro-optical systems, with the blanking electrode 301 and a wiring (W) for turning on/off the electrode being formed thereon. Also shown in FIG. 3 is an electron lens 303 which is formed of three aperture electrodes and which uses two unipotential lenses 303a and 303b having a converging function, in which the upper and lower electrodes are made at the same acceleration voltage VO and the middle electrode is held at another voltage V1 or V2.

Figure 4A:
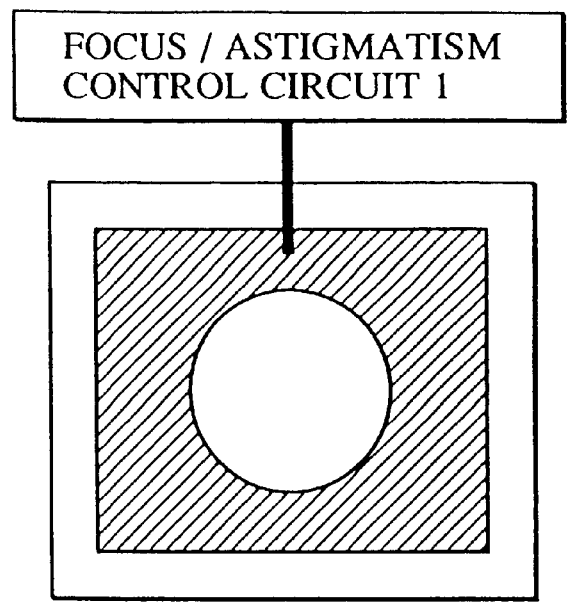
FIGS. 4A and 4B show electrodes of the element electro-optical system.

The shapes of the upper, middle and lower electrodes of the unipotential lens 303a and the upper and lower electrodes of the unipotential lens 303b are shown in FIG. 4A. The upper and lower electrodes of the unipotential lenses 303a and 303b are set at an electrical potential common to all of the element electro-optical systems by means of a focus/astigmatism control circuit 1 to be described later. Since the middle electrode of the unipotential lens 303a is capable of being set at an electrical potential for each element electro-optical system by the focus/astigmatism control circuit 1, the focal length of the unipotential lens 303a can be set for each element electro-optical system.

Figure 4B:
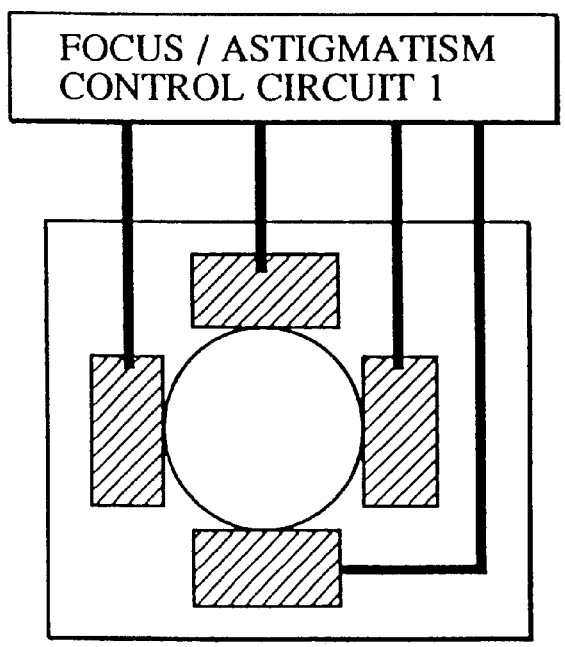

Further, the middle electrode of the unipotential lens 303b is formed of four electrodes, shown in FIG. 4B, in which the electrical potential of each electrode can be individually set by a focus/astigmatism control circuit 1, and can be individually set for each element electro-optical system. Therefore, the unipotential lens 303b is capable of making the focal length different at a perpendicular cross section, and the focal length can be set individually for each element electro-optical system 3. As a result, by controlling the electrical potential of each middle electrode of the element electro-optical system, the electro-optical characteristics (e.g., the intermediate image formation position, astigmatism, etc.) of each element electro-optical system can be controlled.

The electron beam, which is substantially collimated by the condenser lens 2, forms an intermediate image of the electron source 1 by the electron lens 302 via the blanking electrode 301 and the aperture (AP). At this time, if an electrical field is not applied between the electrodes of the blanking electrode 301, the electron beam is not deflected and results in an electron beam 305 shown in FIG. 3. Meanwhile, if an electrical field is applied between the electrodes of the blanking electrode 301, the electron beam is deflected and results in an electron beam 306, also shown in FIG. 3. Thereupon, since the electron beam 305 and the electron beam 306 have distribution angles which are mutually different at the object plane of the reduction electro-optical system 4, the electron beams 305 and 306 are caused to enter mutually different regions at the pupil position (on the plane P shown in FIG. 1) of the reduction electro-optical system 4. Therefore, a blanking aperture BA for permitting only the electron beam 305 to pass through is provided at the pupil position (on the plane P shown in FIG. 1) of the reduction electro-optical system 4.

Further, in each element electro-optical system 3, in order to correct for image plane curvature and astigmatism, which occur when the intermediate image formed by each element electro-optical system is reduction-projected on an exposed surface by the reduction electro-optical system 4, by individually setting the electrical potentials of the two middle electrodes of each element electro-optical system, the electro-optical characteristics (e.g., the intermediate image formation position, astigmatism, etc.) of each element electro-optical system are made different. However, in this embodiment, the element electro-optical system inside the same sub-array is caused to have the same electro-optical characteristics in order to reduce the wiring between the middle electrode and the focus/astigmatism control circuit 1, and the electro-optical characteristics (e.g., the intermediate image formation position, astigmatism, etc.) of the element electro-optical system are controlled for each sub-array.

Furthermore, in order to correct for distortion aberration, which occurs when a plurality of intermediate images are reduction-projected on an exposed surface by the reduction electro-optical system 4, the distortion characteristics of the reduction electro-optical system 4 are known beforehand, and on the basis of these, the position of each element electro-optical system in a direction perpendicular to the optical axis of the reduction electro-optical system 4 is set.

Figure 5:
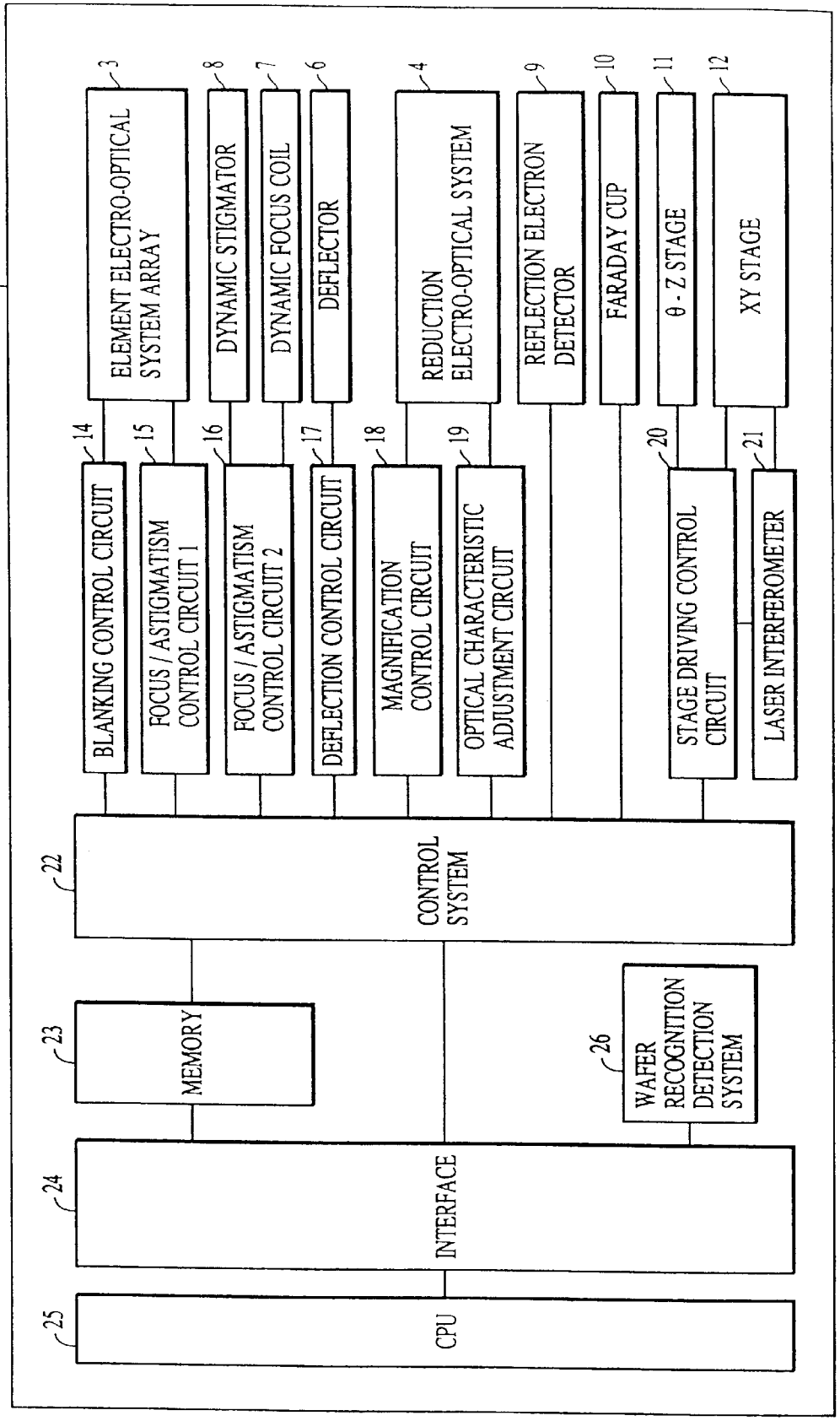
FIG. 5 shows a system configuration according to the present invention.

Next, the system block diagram of the electron beam exposure apparatus of the present invention is shown in FIG. 5.

A blanking control circuit 14 is a control circuit for individually controlling the on/off operation of the blanking electrode of each element electro-optical system of the element electro-optical system array 3. A first focus/astigmatism control circuit 15 is a control circuit for individually controlling the electro-optical characteristics (e.g., the intermediate image formation position, astigmatism, etc.) of each element electro-optical system of the element electro-optical system array 3.

A second focus/astigmatism control circuit 16 is a control circuit for controlling the focus position and astigmatism of the reduction electro-optical system 4 by controlling the dynamic stigmator 8 and the dynamic focus coil 7. A deflection control circuit 17 is a control circuit for controlling the deflector 6. A magnification adjustment circuit 18 is a control circuit for controlling the magnification of the reduction electro-optical system 4. An optical characteristic circuit 19 is a control circuit for controlling the rotation aberration and the optical axis by varying the excitation current of an electromagnetic lens which constitutes the reduction electro-optical system 4.

A stage driving control circuit 20 is a control circuit for drivingly controlling the θ-Z stage 11 and for drivingly controlling the XY stage 12 in cooperation with a laser interferometer 21, which detects the position of the XY stage 12. A control system 22 controls synchronously the above-described plurality of control circuits, the reflection electron detector 9 and the Faraday cup 10 for the purposes of exposure and alignment based on control data from a memory 23, in which drawing patterns are stored. The control system 22 is controlled by a CPU 25, which controls the entire electron beam exposure apparatus via an interface 24. A wafer recognition detection system 26 detects, for example, a bar code, written in a cassette for storing a plurality of wafers before the wafers are exposed or a plurality of the above-mentioned wafers. By way of example, the bar code can contain information regarding the pattern to be exposed onto the respective wafer. Reference numeral 100 denotes an electron beam exposure apparatus having the above-described structural elements.

[Description of the Structural Elements which Constitute the Electron Beam Exposure System]

Figure 6:
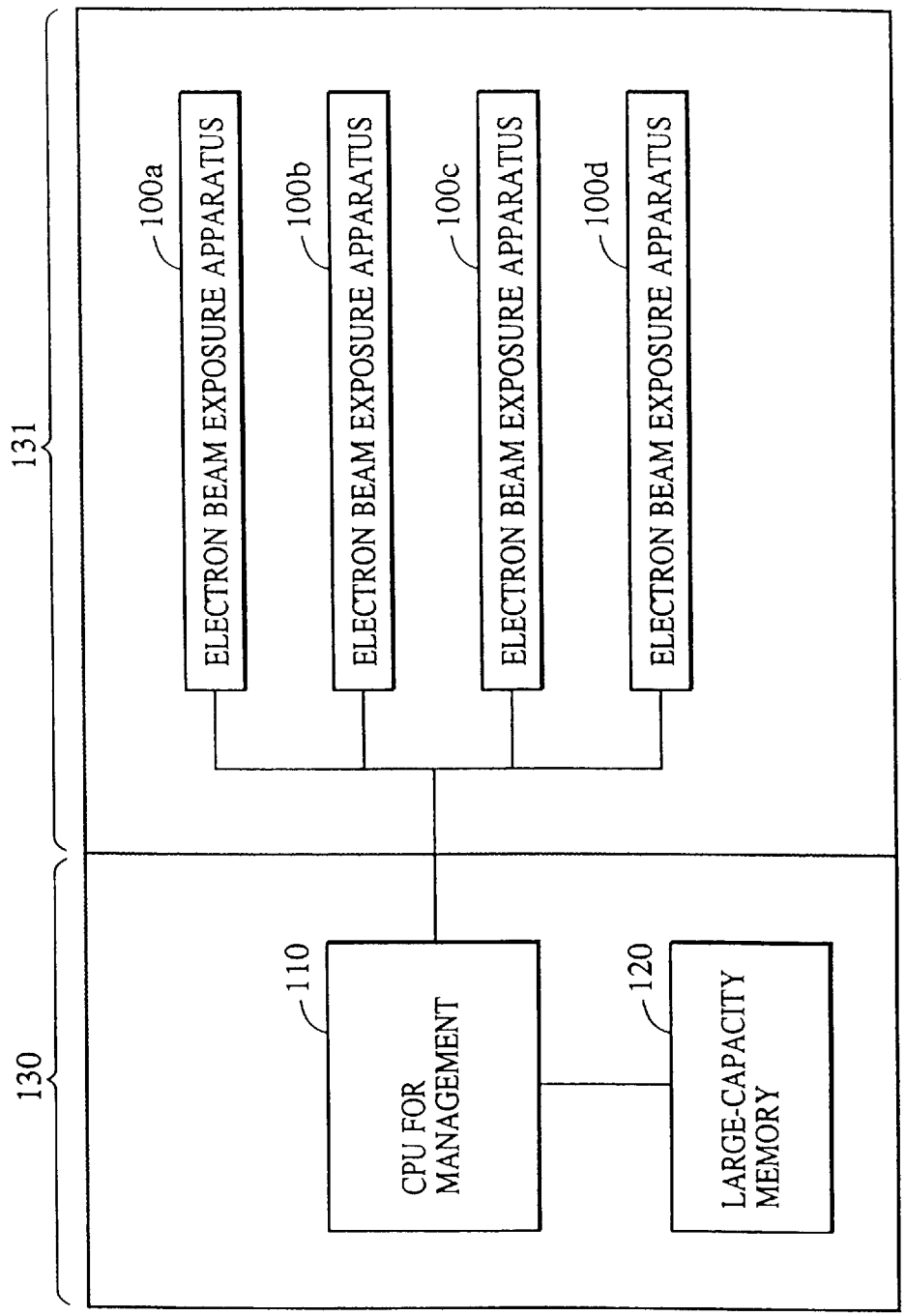
FIG. 6 shows an electron beam exposure system.

Referring to FIG. 6, the construction of the electron beam exposure system of the present invention will be described in more detail below.

Shown in FIG. 6, by way of example, are electron beam exposure apparatuses 100a, 100b, 100c and 100d, a controlling (management) CPU 110, which sends out control data for controlling at least one electron beam exposure apparatus, as required, to the electron beam exposure apparatuses 100a, 100b, 100c and 100d, and generating control data exclusively used for a particular one or more of the electron beam exposure apparatuses, corresponding to a pattern, from pattern data to be exposed onto a wafer, and a large-capacity memory 120 for storing a plurality of control data exclusively used for a particular one or more of the electron beam exposure apparatuses. Of course, the present invention is not limited to the use of four electron beam exposure apparatuses. Rather, fewer, or more, can be utilized, as desired.

In this embodiment, a space (compartment) 130 where the controlling CPU 110 and the large-capacity memory 120 are disposed has a lower degree of cleanness than a space (compartment) 131 where the electron beam exposure apparatuses 100a, 100b, 100c and 100d are disposed. As a result, the area of the expensive space (compartment) 131 can be reduced, because the controlling CPU 110 and the large-capacity memory 120, which do not require particular cleanness for the space where they are disposed, are not disposed in the space (compartment) 131 having a high degree of cleanness. The compartment 131 having a high degree of cleanness is expensive from the point of view of construction costs and running costs. By reducing the amount of this space, the manufacturing costs of devices manufactured by the electron beam exposure system can be substantially reduced.

[Description of the Operation]

Referring to FIGS. 5 through 7B, the operation of the electron beam exposure system of this embodiment will be described below.

The controlling CPU 110 has prestored in the large-capacity memory 120, exposure control data exclusively used for the electron beam exposure apparatuses, corresponding to various patterns to be exposed by the electron beam exposure apparatuses 100a, 100b, 100c and 100d, for example.

Or, if there is a pattern to be exposed by a particular electron beam exposure apparatus, the pattern data of that pattern is input to the controlling CPU 110. Then, the CPU 110 determines the minimum deflection amount that the deflector of the electron beam exposure apparatus should give to the electron beam on the basis of the minimum line width, and the type and shape of the line width for the pattern. Next, the pattern is divided into pattern data for each exposure region of the electron beam for each element electro-optical system, then a common-source array formed of array elements FME (FIG. 7A) is set with the minimum deflection amount as an array spacing, and the pattern data is converted into data represented on the common-source array for each element electro-optical system. Based on this data, exposure control data is formed. Hereinafter, for the sake of simplicity of description, a process for forming exposure control data from pattern data during exposure using two element electro-optical systems a and b will be described in detail.

Figure 7A:
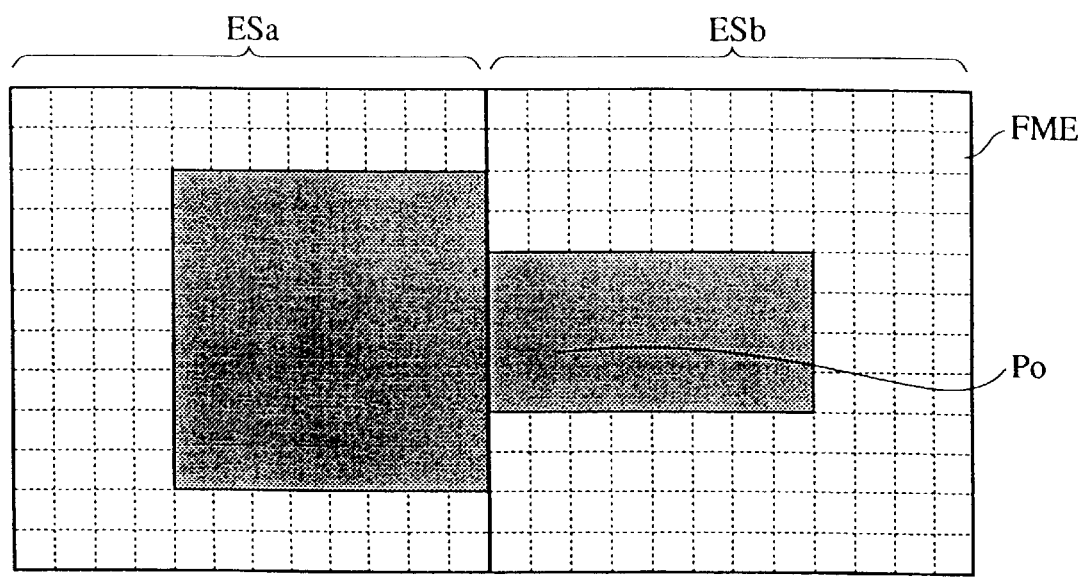
FIGS. 7A and 7B show patterns to be exposed in exposure regions of each element electro-optical system.

FIG. 7A shows one continuous pattern P to be exposed onto a wafer 5. For the pattern P, rectangular exposure regions Esa and Esb of the element electro-optical systems a and b are set in such a manner that the boundaries of the exposure regions Esa and Esb are in contact with each other. Then, a common-source array formed of an array element FME is set with the minimum deflection amount as an array spacing, and the pattern data is converted into data represented on the common-source array for each element electro-optical system.

Figure 7B:
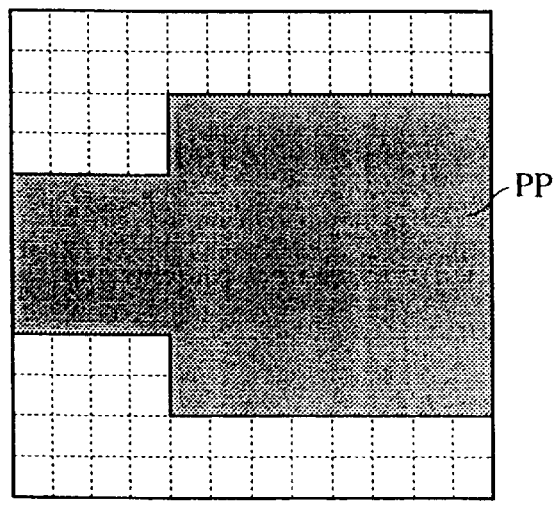

Next, as shown in FIG. 7B, at least one of the element electro-optical systems a and b determines a region PP (hatching portion) formed of the array position when the pattern is exposed. Here, when a plurality of electron beams are positioned at the region PP on the array, by aligning the positions of the electron beams and performing exposure, all of the patterns to be exposed onto the wafer can be exposed. Also, when a plurality of electron beams are positioned at other than the region PP on the array, by deflecting the electron beams without aligning the position of these electron beams, wasteful deflection of the electron beams can be reduced during exposure.

Accordingly, the array position at which the electron beam should be aligned is determined, and deflection control data for aligning the position of the electron beam at only the array position (the array position belonging to the region PP) to be aligned is formed on the basis of data for the region PP shown in FIG. 7B.

To expose a pattern, it is necessary to radiate an electron beam from each element electro-optical system by controlling the blanking electrode on the basis of the array position at which a plurality of electron beams are each aligned. FIG. 7A also shows the radiation of an electron beam corresponding to the array position of the electron beam for each element electro-optical system. Thus, blanking control data for controlling the amount of radiation of the electron beam corresponding to the array position of each element electro-optical system is formed on the basis of the data shown in FIG. 7A.

On the basis of the above-described deflection control data, and blanking control data for each element electro-optical system, the controlling CPU 110 forms exposure control data with the array position at which at least one electron beam exposes and the operation time (which determines the amount of radiation of the electron beam) of the blanking electrode of each element electro-optical system at that array position as elements, as shown in FIG. 8. Then, the exposure control data is stored in the large-capacity memory 120.

When the wafer to be exposed is transported, each of the electron beam exposure apparatuses 100a, 100b, 100c and 100d causes the wafer recognition detection system 26 to detect a bar code written in a wafer or a wafer cassette. As discussed above, the bar code can include information regarding the pattern to be exposed onto the wafer. The control system 22 compares the detected pattern information with the pattern information of the pattern corresponding to the plurality of exposure control data stored in the memory 23. When there is no matching pattern information, the detected pattern information is transmitted to the controlling CPU 110.

When pattern information is received, the controlling CPU 110 searches the exposure control data for exposing the pattern corresponding to the pattern information in the large-capacity memory 120. When it is determined that the data is stored therein, the exposure control data is transmitted to the electron beam exposure apparatus which had transmitted the pattern information. When the data is not stored therein, an alarm signal is generated, informing the operator.

The control system 22 causes the exposure control data transmitted from the controlling CPU 110 to be stored in the memory 23. At this time, exposure control data with a low frequency of use, from among the plurality of exposure control data stored in the memory 23, is deleted.

In each of the electron beam exposure apparatuses 100a, 100b, 100c and 100d, when a wafer to be exposed is prepared, the control system 22 selects exposure control data corresponding to the pattern information detected beforehand by the wafer recognition detection system 26 from the plurality of exposure control data stored in the memory 23. Then, on the basis of the selected exposure control data, the steps described below are performed.

(Step 1)

The control system 22 instructs the deflection control circuit 17 to deflect a plurality of electron beams from the element electro-optical system using the sub-deflector of the deflector 6, and instructs the blanking control circuit 14 to turn on/off the blanking electrode of each element electro-optical system according to the pattern to be exposed onto the wafer 5. At this time, the XY stage 12 is moving continuously in the X direction, and the deflection control circuit 17 controls the deflection position of the electron beam, including the amount of movement of the XY stage 12.

Figure 9:
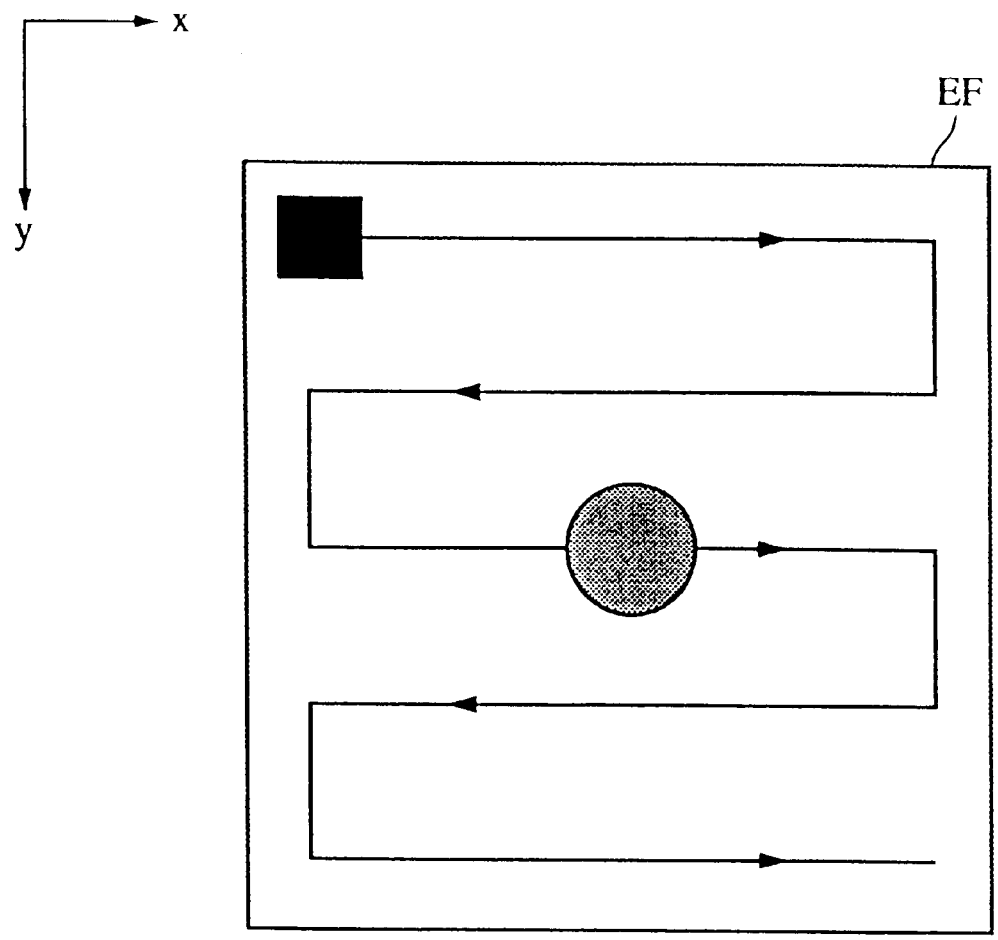
FIG. 9 shows an exposure field or region (EF) of the element electro-optical system.
Figure 10:
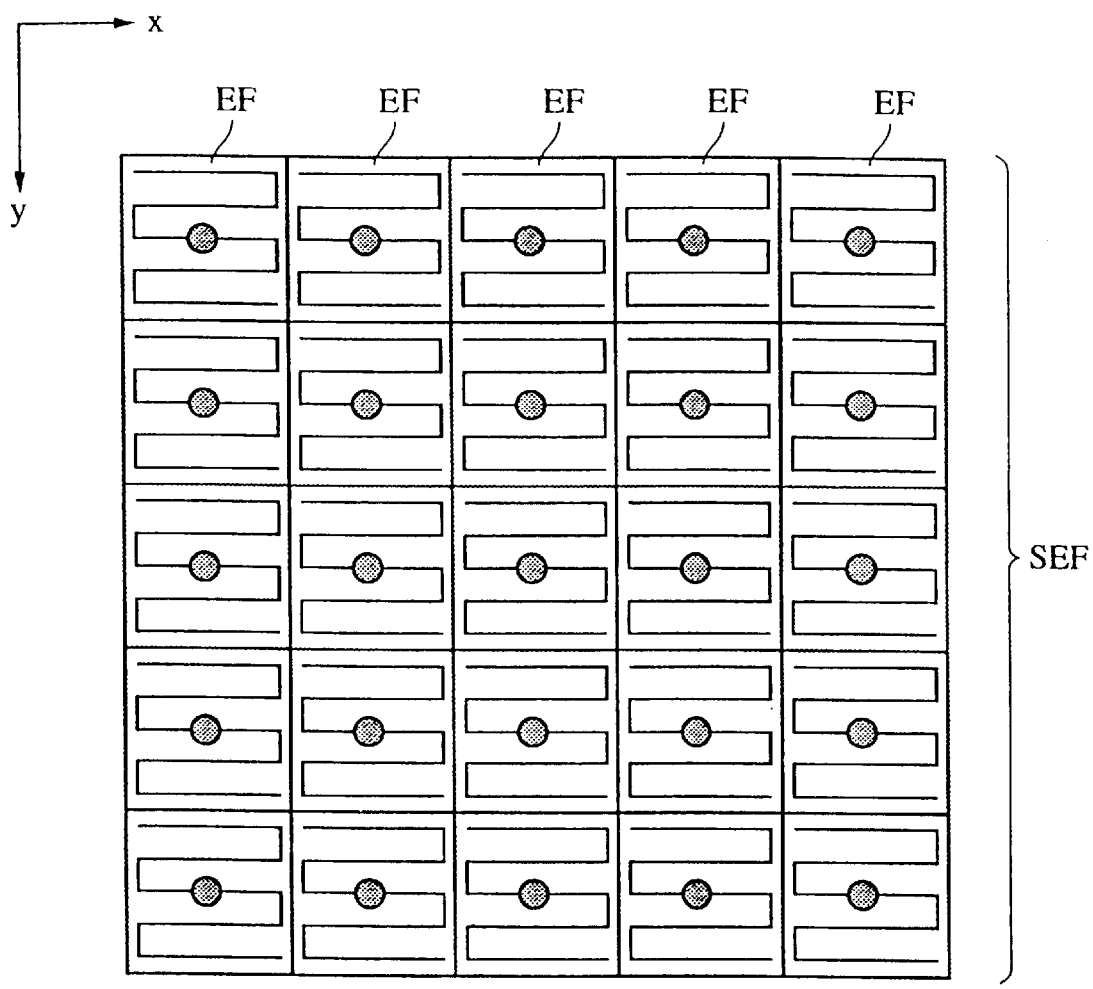
FIG. 10 shows a sub-array exposure field (SEF)
Figure 11:
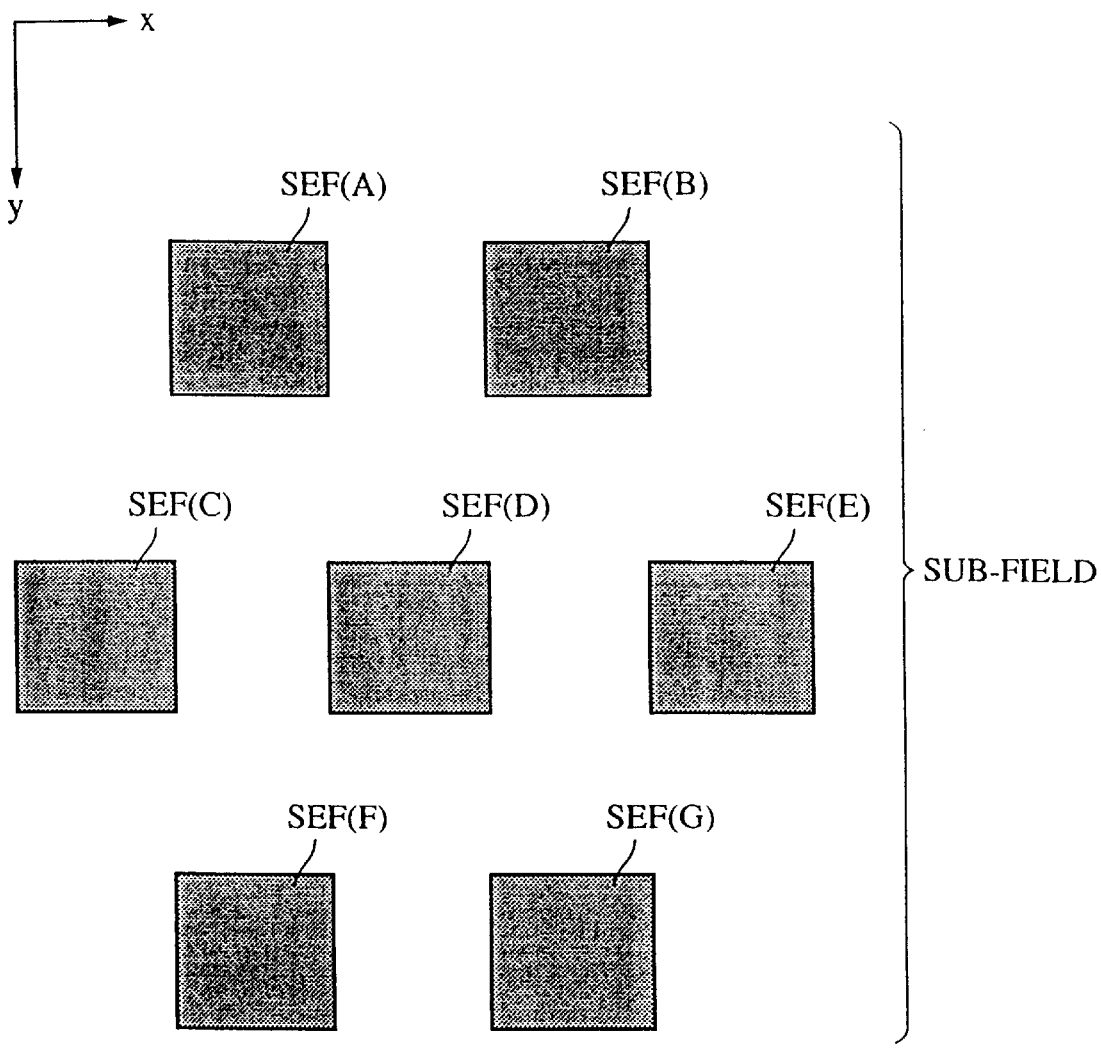
FIG. 11 shows a sub-field.

As a result, the position of the electron beam from one element electro-optical system is aligned within the exposure field (EF) on the wafer 5 as shown in FIG. 9 on the basis of the selected exposure control data, and the electron beam is radiated. Also, as shown in FIG. 10, the exposure fields (EF) of a plurality of element electro-optical systems within the sub-array are set in such a manner as to be adjacent to each other. As a result, a sub-array exposure field (SEF) formed by a plurality of exposure fields (EF) is exposed onto the wafer 5. At the same time, a sub-field formed of a sub-array exposure field (SEF) formed from each of the sub-arrays A to G shown in FIG. 11 is exposed on the wafer 5.

(Step 2)

Figure 12:
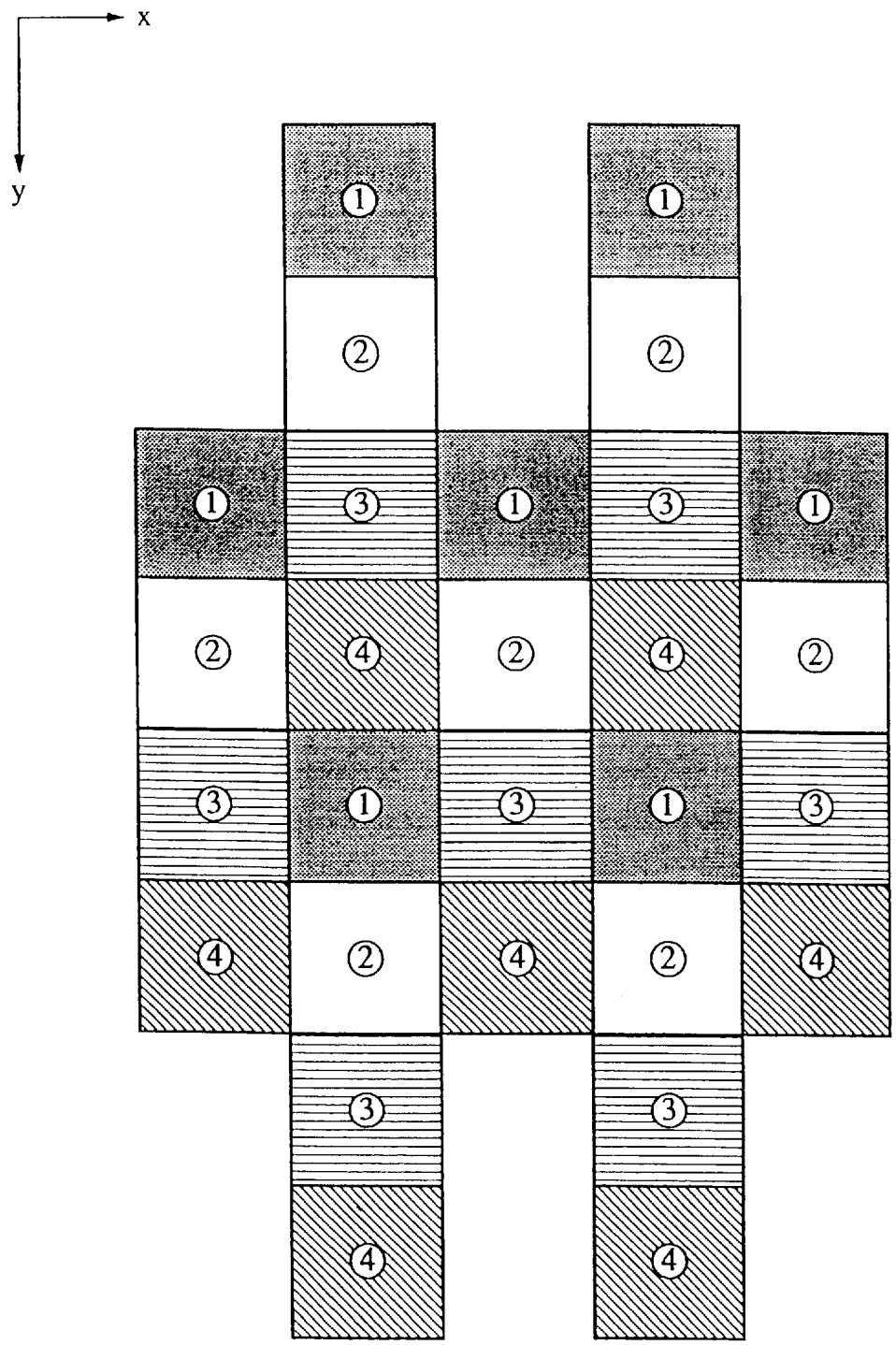
FIG. 12 shows a wafer entire-surface exposure.

After a sub-field ① shown in FIG. 12 is exposed, in order to expose a sub-field ②, the control system 22 instructs the deflection control circuit 17 to deflect a plurality of electron beams from the element electro-optical system array using the sub-deflector of the deflector 6. At this time, the control system 22 instructs the second focus/astigmatism control circuit to control the dynamic focus coil 7 on the basis of predetermined dynamic focus correction data so as to correct the focus position of the reduction electro-optical system 4 and to control a dynamic stigmator 8 on the basis of predetermined dynamic astigmatism correction data so as to correct the astigmatism of the reduction electro-optical system 4. Then, the operation in step 1 is performed to expose the sub-field ②.

By repeating the above steps 1 and 2, sub-fields are exposed in sequence as sub-fields ③ and ④ as shown in FIG. 12, and thus, the entire surface of the wafer is exposed.

Next, an embodiment of a method of producing devices using the above-described electron beam exposure system will be described.

Figure 13:
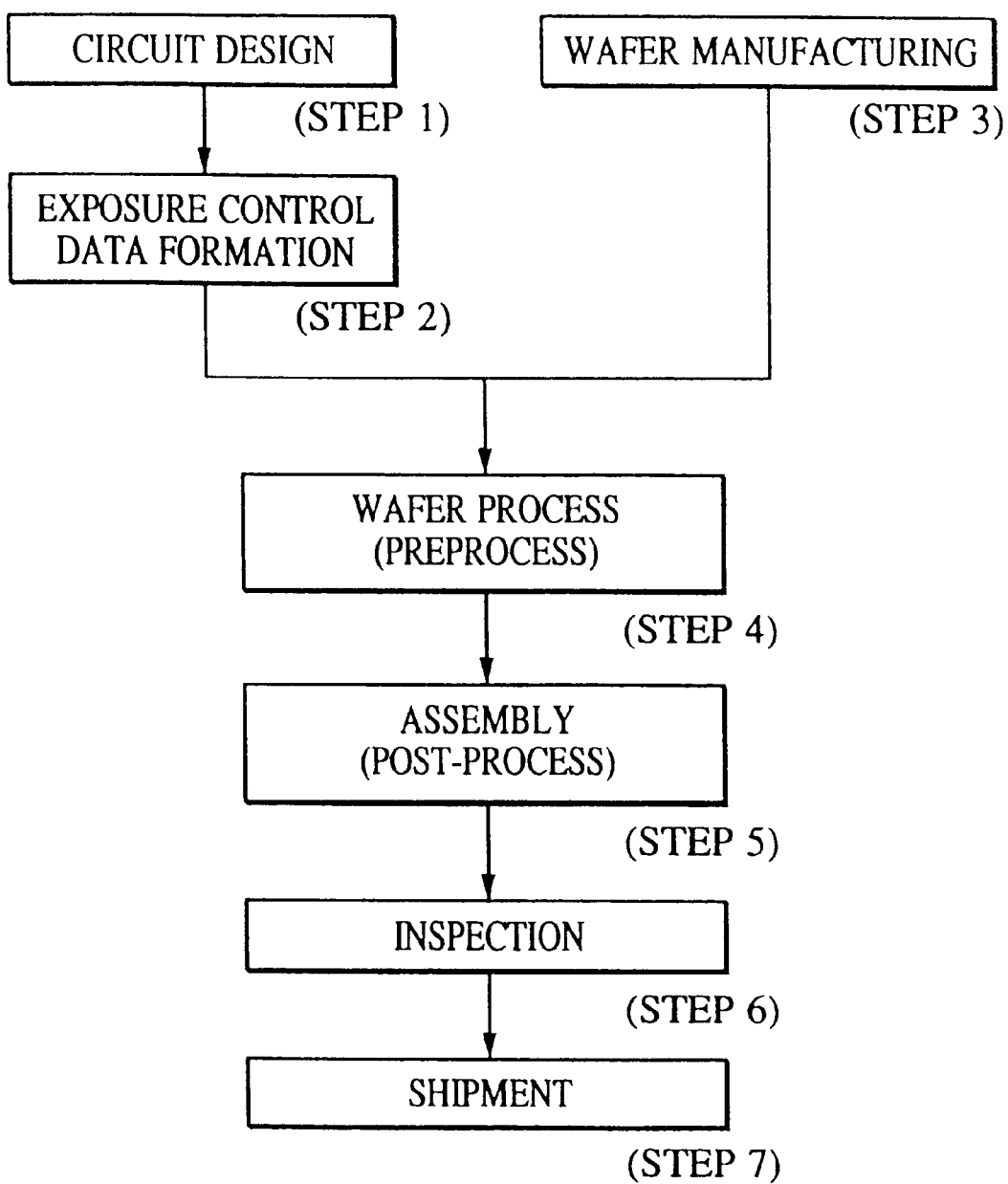
FIG. 13 shows a flow chart for manufacturing microscopic devices.

FIG. 13 shows a flow chart for producing microscopic devices (e.g., semiconductor chips, such as ICs or LSIs, liquid-crystal panels, CCDs, thin-film magnetic heads, micromachines, and the like). In step 1 (circuit design), circuit design of a semiconductor device is performed. In step 2 (exposure control data formation), exposure control data for the exposure apparatus is generated on the basis of the designed circuit pattern. Meanwhile, in step 3 (wafer production), a wafer is produced by using a silicon material or the like. Step 4 (wafer process) is called a preprocess, in which an actual circuit is formed on a wafer by lithographic technology using an exposure apparatus, to which the above-mentioned prepared exposure control data has been input, and a wafer. The next step 5 (assembly) is called a post-process, which is a step for forming the wafer produced in step 4 into a semiconductor chip, including an assembly step (dicing, bonding), a packaging step (chip encapsulation) and the like. In step 6 (inspection), inspection, such as an operation confirmation test and a durability test for a semiconductor device produced in step 5, is performed. Through these steps, a semiconductor device is completed, and this device is then shipped (step 7).

Figure 14:
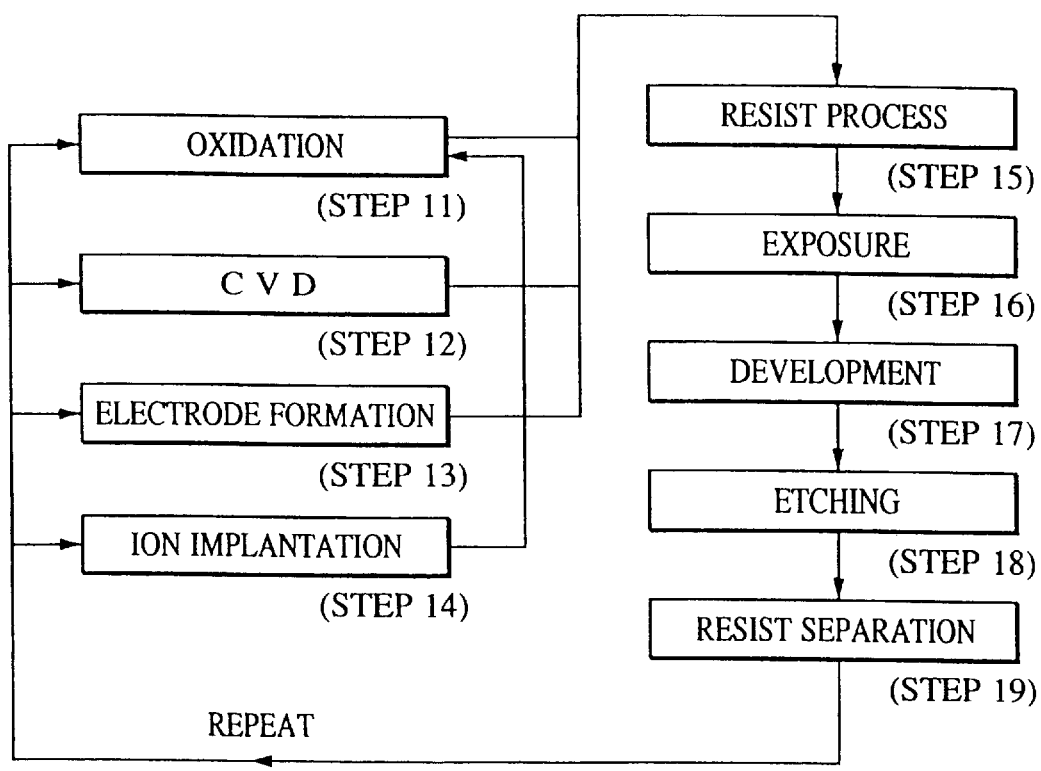
FIG. 14 shows a wafer process.

FIG. 14 shows a detailed flow chart of the above-described wafer process. In step 11 (oxidation), the surface of the wafer is oxidized. In step 12 (CVD), an insulating film is formed on the surface of the wafer. In step 13 (electrode formation), an electrode is formed on the wafer by evaporation. In step 14 (ion implantation), ions are implanted into the wafer. In step 15 (resist process), a photosensitive agent is coated onto the wafer. In step 16 (exposure), a circuit pattern is printed and exposed onto the wafer by the above-described exposure apparatus. In step 17 (development), the exposed wafer is developed. In step 18 (etching), portions other than the developed resist image are removed. In step 19 (resist separation), the resist which becomes unnecessary after etching is removed. By repeatedly performing these steps, circuit patterns are formed in multilayers on the wafer.

The use of the manufacturing method of this embodiment makes it possible to manufacture semiconductor devices with a high degree of integration, which has hitherto been difficult to attain, at low cost.

Except as otherwise disclosed herein, the various components shown in outline or in block form in the figures are individually well known and their internal construction and operation are not critical either to the making or using of this invention or to a description of the best mode of the invention.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalence of the claims are therefore intended to be embraced therein.

What is claimed is:

1. An electron beam exposure apparatus comprising:
   a memory which stores control data for exposure;
   a detector for detecting pattern information corresponding to control data for exposure;
   a controller, which sends the detected pattern information regarding a pattern to be exposed onto a wafer, receives control data for exposure corresponding to the sent pattern information when said memory does not store control data corresponding to the sent pattern information and stores the received control data in said memory; and
   a deflector which deflects an electron beam in accordance with the exposure control data.

2. An electron beam exposure apparatus according to claim 1, further comprising a detector which detects the pattern information regarding the pattern to be exposed onto the wafer.

3. An electron beam exposure apparatus according to claim 1, wherein said memory stores a plurality of control data.

4. An electron beam exposure apparatus according to claim 3, wherein said controller deletes selected ones of the plurality of control data stored in said memory.

5. An electron beam exposure apparatus according to claim 4, wherein the control data to be deleted is control data whose frequency of use is low.

6. A method of manufacturing devices comprising the steps of:
    detecting pattern information corresponding to control data for exposure;
    comparing, in a controller, detected pattern information regarding a pattern to be exposed onto a wafer, with pattern information corresponding to control data for exposure stored in a memory;
    sending the detected pattern information from the controller when information corresponding to control data for exposure in the memory is not provided;
    receiving control data corresponding to the sent pattern information;
    storing the received control data in the memory; and
    deflecting an electron beam and exposing the wafer in accordance with the control data stored in the memory.

7. A method according to claim 6, further comprising a process of detecting pattern information regarding the pattern to be exposed onto the wafer.

8. A method according to claim 6, wherein the memory stores a plurality of control data.

9. A method according to claim 8, wherein the controller deletes selected ones of a plurality of control data stored in the memory.

10. A method according to claim 9, wherein the controller deletes control data whose frequency of use is low.

11. A method according to claim 6, further comprising a process of coating the wafer with a photosensitive material and a process of developing the exposed wafer.

12. An exposure device controlling system comprising:
    a memory which stores control data for exposure; and
    a controller, which retrieves control data for exposure from the memory corresponding to exposure pattern information and sent from a device for exposure, and sends the control data for exposure retrieved from the memory that corresponds to the exposure pattern information to the device for exposure.

13. A system according to claim 12, wherein said memory stores a plurality of control data.

14. A system according to claim 12, further comprising data production means for producing the control data for said electron beam exposure device from the pattern information.

15. A system according to claim 12, wherein the control data comprises at least one of data for controlling an electron beam deflection position and data for controlling an irradiation period at the electron beam deflection position.

16. A system according to claim 12, wherein said controlling system is provided in a space in which cleanness is lower than that in which the electron beam exposure device is provided.

17. A method of controlling an exposure apparatus, comprising the steps of:
    storing control data for exposure in a memory;
    retrieving control data for exposure from the memory corresponding to exposure pattern information and sent from a device for exposure; and
    sending the control data for exposure retrieved from the memory that corresponds to the exposure pattern information to the device for exposure.

18. A method according to claim 17, wherein the memory stores a plurality of control data.

19. A method according to claim 17, further comprising producing the control data for the electron beam exposure device from the pattern information.

20. A method according to claim 17, wherein the control data comprises at least one of data for controlling an electron beam deflection position and data for controlling an irradiation period at the electron beam deflection position.

21. An exposure apparatus comprising:
    a memory which stores data;
    a detector for detecting information relating to a pattern to be exposed on a wafer; and
    a controller, which requires control data for exposure corresponding to the detected information when said memory does not store control data corresponding to the detected information, and stores the required control data in said memory.

22. A method of manufacturing devices, comprising the steps of:
    detecting information relating to a pattern to be exposed on a wafer;
    requiring control data for exposure corresponding to the detected information when the control data corresponding to the detected information is not stored in a memory;
    storing the required control data in the memory;
    exposing the wafer in accordance with the control data stored in the memory; and
    developing the exposed wafer.

* * * * *

UNITED STATES PATENT AND TRADEMARK OFFICE
CERTIFICATE OF CORRECTION

PATENT NO. : 6,472,674 B1
DATED : October 29, 2002
INVENTOR(S) : Masato Muraki

It is certified that error appears in the above-identified patent and that said Letters Patent is hereby corrected as shown below:

Column 1,
Line 65, "which" should read -- which control --.

Column 3,
Line 39, "a wafer entire-surface exposure;" should read -- an entire-surface exposure for a wafer; --.

Column 5,
Line 19, "in common use" should read -- commonly used --.
Line 26, "VO" should read -- V0 --.

Column 8,
Line 23, "other" should read -- positions other --.

Column 11,
Line 48, the first occurrence of "and" should be deleted.

Signed and Sealed this

Tenth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO.      : 6,472,674 B1
DATED           : October 29, 2002
INVENTOR(S)     : Masato Muraki It is certified that error appears in the above-identified patent and that said Letters Patent is hereby corrected as shown below:

<u>Title page,</u>
Insert

-- [30]    Foreign Application Priority Data

June 12, 1996   [JP]   Japan . . . . . . 8-150991 --.

Signed and Sealed this

Twenty-ninth Day of July, 2003

JAMES E. ROGAN
*Director of the United States Patent and Trademark Office*